(12) United States Patent
Chuang et al.

(10) Patent No.: US 11,342,291 B2
(45) Date of Patent: May 24, 2022

(54) SEMICONDUCTOR PACKAGES WITH CRACK PREVENTING STRUCTURE

(71) Applicant: TAIWAN SEMICONDUCTOR MANUFACTURING COMPANY LTD., Hsinchu (TW)

(72) Inventors: Yao-Chun Chuang, Hsinchu (TW); Hong-Seng Shue, Hsinchu County (TW); Chen-Nan Chiu, Hsinchu (TW); Li-Huan Chu, Hsinchu (TW); Mirng-Ji Lii, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/868,235

(22) Filed: May 6, 2020

(65) Prior Publication Data
US 2020/0357760 A1 Nov. 12, 2020

Related U.S. Application Data

(60) Provisional application No. 62/844,590, filed on May 7, 2019.

(51) Int. Cl.
*H01L 23/00* (2006.01)
*H01L 23/48* (2006.01)

(52) U.S. Cl.
CPC ............ *H01L 24/05* (2013.01); *H01L 23/481* (2013.01); *H01L 24/13* (2013.01)

(58) Field of Classification Search
CPC ........ H01L 24/05; H01L 23/481; H01L 24/13
See application file for complete search history.

(56) References Cited

U.S. PATENT DOCUMENTS

| | | | |
|---|---|---|---|
| 2002/0121692 A1* | 9/2002 | Lee .................... | H01L 24/12 257/737 |
| 2009/0108447 A1* | 4/2009 | Jo ..................... | H01L 23/585 257/738 |
| 2014/0353819 A1* | 12/2014 | Chuang ............ | H01L 21/76801 257/737 |
| 2016/0064357 A1* | 3/2016 | Choe ................. | H01L 23/481 257/774 |
| 2016/0079191 A1* | 3/2016 | Chen ................. | H01L 23/3142 257/773 |
| 2017/0301637 A1* | 10/2017 | Huang ............... | H01L 24/03 |
| 2018/0204828 A1* | 7/2018 | Lu .................... | H01L 22/20 |
| 2020/0203300 A1* | 6/2020 | Huang ............... | H01L 23/49838 |
| 2021/0005553 A1* | 1/2021 | Jee ................... | H01L 23/5386 |
| 2021/0082846 A1* | 3/2021 | Lin ................... | H01L 23/528 |

* cited by examiner

*Primary Examiner* — Douglas W Owens
(74) *Attorney, Agent, or Firm* — WPAT, P.C., Intellectual Property Attorneys; Anthony King

(57) ABSTRACT

A semiconductor package includes a semiconductor substrate, an interconnect structure disposed over the substrate, a first passivation layer disposed over an interconnect structure, a contact pad disposed over the first passivation layer, a dummy pattern disposed around the contact pad and over the first passivation layer, and a second passivation layer overlaying the dummy pattern and the contact pad.

20 Claims, 8 Drawing Sheets

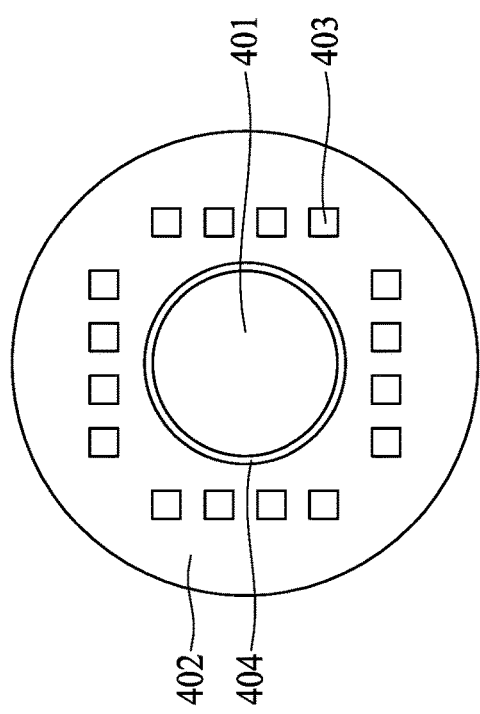
FIG. 5C
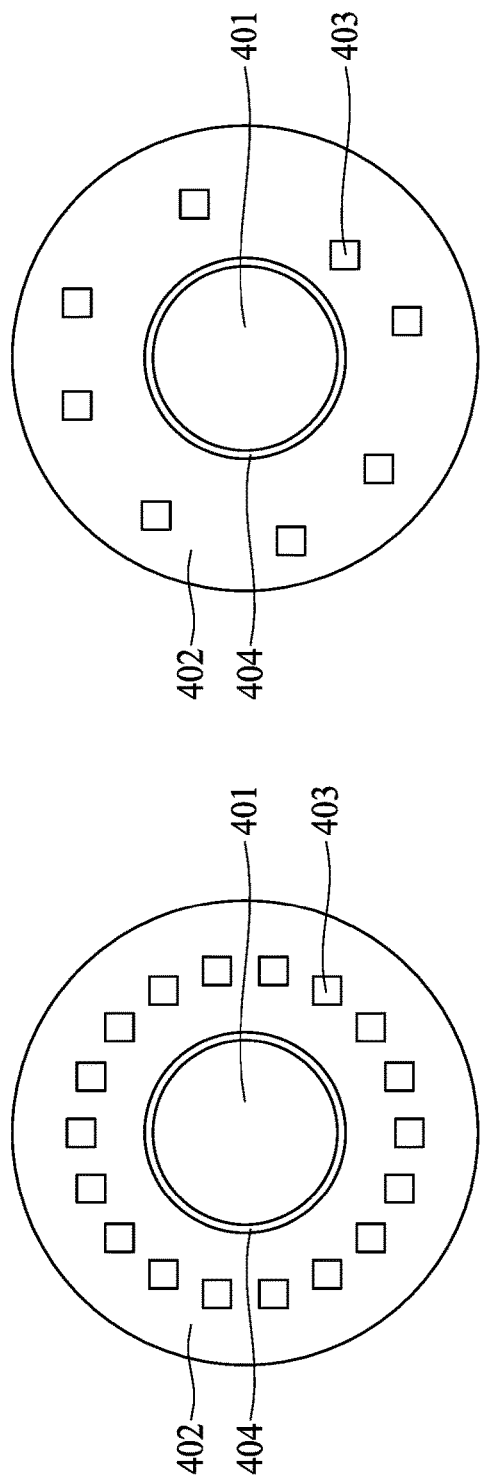
FIG. 5E
FIG. 5D

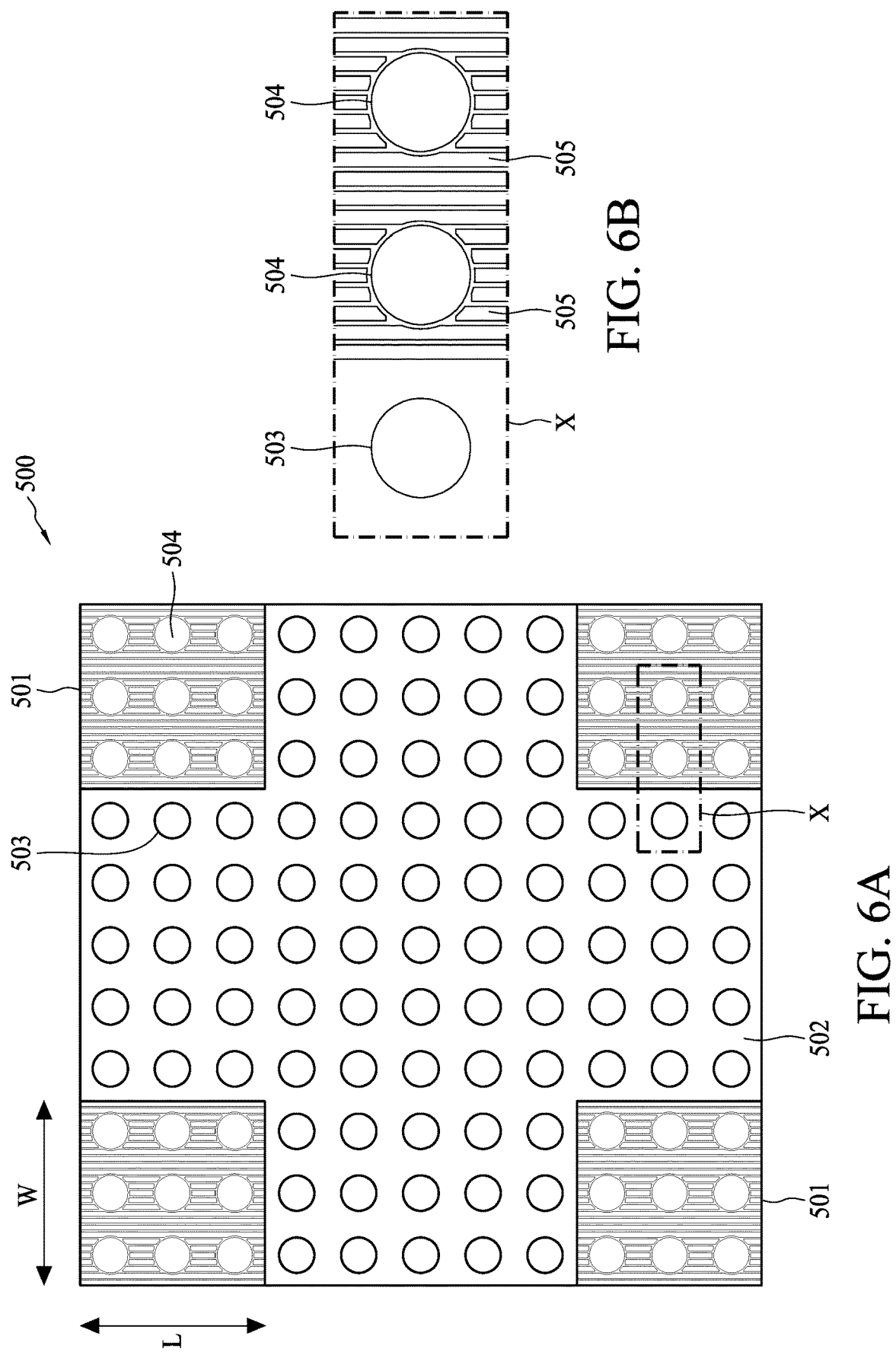

SEMICONDUCTOR PACKAGES WITH CRACK PREVENTING STRUCTURE

PRIORITY CLAIM AND CROSS-REFERENCE

This application claims priority to U.S. Provisional Application No. 62/844,590 filed on May 7, 2019, entitled "Semiconductor Packages with Crack Preventing Structure," which application is hereby incorporated herein by reference.

BACKGROUND

Electronic equipments using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a wafer level packaging (WLP) is widely used for its low cost and relatively simple manufacturing operations. During the WLP operation, a number of semiconductor components are assembled on the semiconductor device. Furthermore, numerous manufacturing operations are implemented within such a small semiconductor device.

However, the manufacturing operations of the semiconductor device involve many steps and operations on such a small and thin semiconductor device. The manufacturing of the semiconductor device in a miniaturized scale becomes more complicated. An increase in a complexity of manufacturing the semiconductor device may cause deficiencies such as poor structural configuration, delamination of components, or other issues, resulting in a high yield loss of the semiconductor device and increase of manufacturing cost. As such, there are many challenges for modifying a structure of the semiconductor devices and improving the manufacturing operations.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 5A to FIG. 5E are top views of a semiconductor structure in accordance with some embodiments of the present disclosure.

FIG. 6A and FIG. 6B are top views of a semiconductor chip in accordance with some embodiments of the present disclosure.

DETAILED DESCRIPTION

Figure 1:
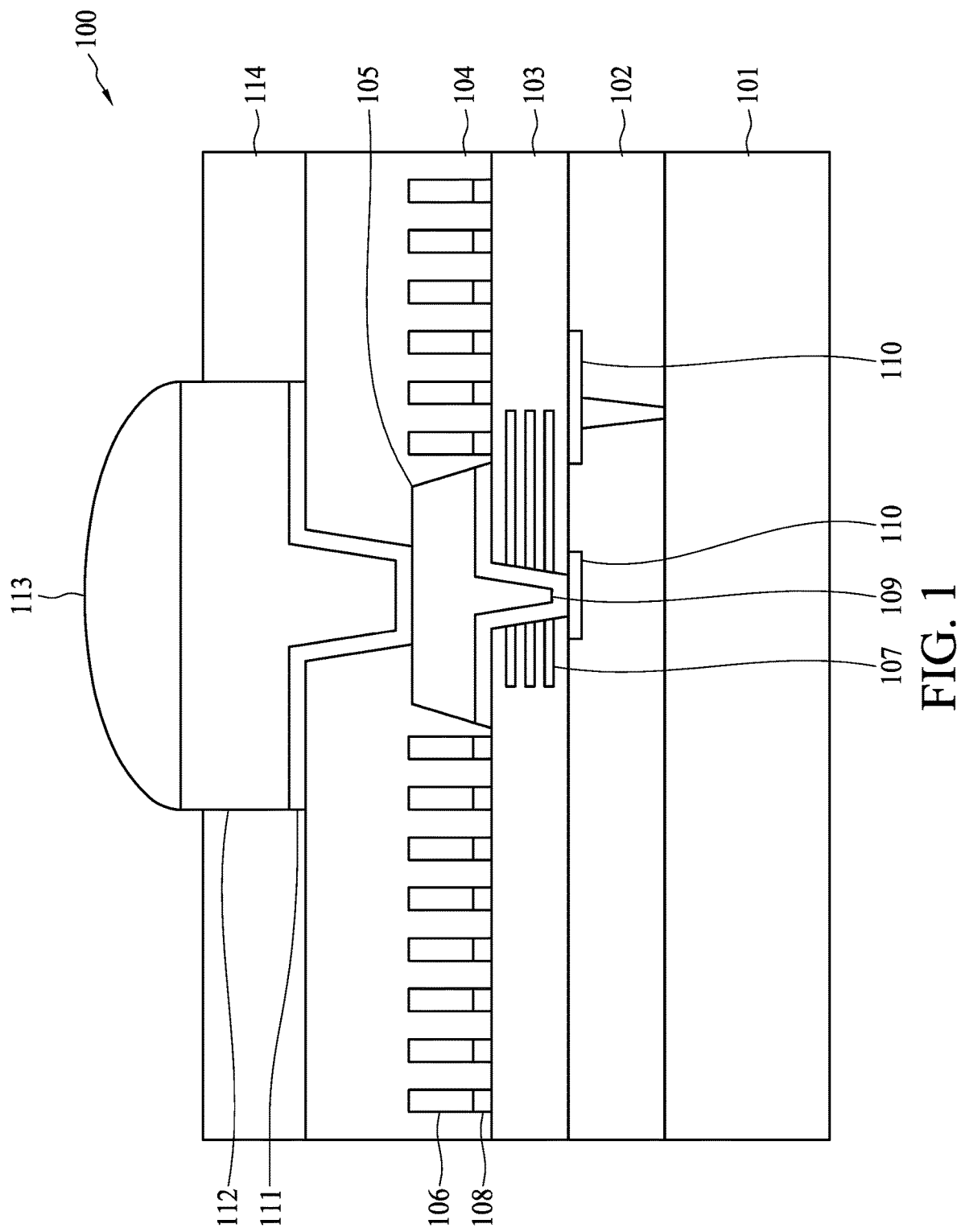
FIG. 1 is a schematic cross sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Wafer level chip scale packaging (WLCSP) is currently widely used because WLCSP is low cost and has relatively simple processes. In a typical WLCSP, post-passivation interconnect (PPI) lines such as redistribution lines (RDLs) are formed on dielectric layers (or passivation layers), followed by the formation of polymer films and bumps.

In some embodiments, a thermal curing process is involved in the formation of the polymer films. During the curing process, the introduction of heat or energy to the polymer creates stress and pressure to the semiconductor chip causing potential cracks to the underlying passivation layers. Such is prevalent at the passivation layers and the interconnect structures of the semiconductor chip. The crack extended in the passivation layer may cause damage to elements, such as metal-insulator-metal (MIM) capacitor, embedded in the passivation layers, and thus reduce package reliability. In some embodiments, the crack issue is more serious at corners of a die or a chip.

A semiconductor package with designed dummy structures placed around a contact pad may be helpful in stopping such cracks to propagate further into the semiconductor structure, acting as a buffer to mitigate stress and pressure during the curing process.

In the present disclosure, a semiconductor structure with improvement is disclosed. The semiconductor structure includes a dummy pattern coupled to or separate from a contact pad overlaying a passivation layer and an interconnect structure. Various configurations of the dummy pattern coupled to or separate from the contact pad are presented for alleviating pressure and releasing stress of the passivation layers and the interconnect structures of the semiconductor chip.

FIG. 1 is a schematic cross sectional view of a semiconductor structure 100 in accordance with various embodiments of the present disclosure. In some embodiments, the semiconductor structure 100 includes a semiconductor substrate 101, an interconnect structure 102, a first passivation layer 103, a second passivation layer 104, a contact pad 105, a dummy pattern 106, an under-bump metallization layer (UBM) 111 and a bump 112. In some embodiments, the semiconductor structure 100 is a semiconductor package.

In some embodiments, the semiconductor substrate 101 may include integrated circuit devices. One of ordinary skill in the art should readily recognize a variety of integrated circuit devices such as transistors, capacitors, resistors, diodes or the combination thereof may be implemented in the semiconductor substrate 101. In some embodiments, the semiconductor substrate 101 may be a bulk silicon substrate or a silicon-on-insulator (SOI) substrate that can be made of material such as germanium, silicon germanium, silicon carbide, gallium arsenide or the like.

In some embodiments, the interconnect structure 102 overlays on one side of the semiconductor substrate 101. The interconnect structure 102 may include conductive lines or conductive vias. In some embodiments, the interconnect structure 102 may be in the form of multiple metal and dielectric layers, and the interconnect structure 102 provides an electrical connection to the integrated circuit devices in the semiconductor substrate 101. In some embodiments, the metal layers in the interconnect structure 102 may be gold, copper, silver, nickel, tungsten, aluminum palladium and/or alloys, and the dielectric layers in the interconnect structure 102 may be silicon oxides, silicon nitrides, silicon carbides or low-k dielectrics.

In some embodiments, the first passivation layer 103 is disposed over the interconnect structure 102 and is in contact with the contact pad 105. The first passivation layer 103 may be made of one or more suitable dielectric material such as undoped silicate glass (USG), silicon oxides, silicon nitrides, silicon oxynitride, silicon carbides or low-k dielectrics. In some embodiments, the first passivation layer may include a polymer, such as epoxy, polyimide, benzocyclobutene (BCB), polybenzoxazole (PBO) and the like. The first passivation layer 103 may have a thickness of about 2 μm to 20 μm.

In some embodiments, a MIM capacitor 107 is disposed within the first passivation layer 103 configured to reserve power supply. The MIM capacitor 107 may include at least one electrode layer, the at least one electrode layer may include conductive materials such as indium tin oxide, aluminum, titanium, titanium nitride, tantalum, tantalum nitride, tungsten, tungsten nitride, molybdenum nitride, copper, platinum, palladium, osmium, ruthenium, iridium dioxide, rhenium dioxide, rhenium trioxide, or a combination thereof. In some embodiments, the MIM capacitor 107 may include a top electrode, a middle electrode and a bottom electrode formed within the first passivation layer 103. In some embodiments, the thickness of each of the top electrode, the middle electrode and the bottom electrode may be about 0.05 μm to 5 μm. The thickness of each of the electrodes in the MIM capacitor 107 may vary and is not limited to the above-mentioned values.

In some embodiments, the contact pad 105 is disposed over the first passivation layer 103 and the interconnect structure 102. The contact pad 105 may be made of aluminum, aluminum copper, aluminum alloys, copper, copper alloys, or the like. The contact pad 105 is electrically connected with the metal layers in the interconnect structure 102. In some embodiments, the second passivation layer 104 is formed over the contact pad 105 and the first passivation layer 103. The second passivation layer 104 may be a single layer or a multiple layer. The second passivation layer 104 may be a polymer layer, the polymer layer may be made of polyimide, epoxy, benzocyclobutene (BCB), polybenzoxazole (PBO). The second passivation layer 104 is formed over a peripheral portion of the contact pad 105 and is patterned to expose part of the contact pad 105.

In some embodiments, a dummy pattern 106 is disposed over the first passivation layer 103. The dummy pattern 106 may be coupled to or separated from the contact pad 105. The dummy pattern 106 may be at least one individual unit disposed alongside the contact pad 105 or it may be configured to surround part or the entire periphery of the contact pad 105. In some embodiments, the dummy pattern 106 may be made of the same material of the contact pad 105.

In some embodiments, a barrier 108 is deposited between the first passivation layer 103 and the contact pad 105. In another embodiment, the barrier 108 is disposed between the first passivation layer 103 and the dummy pattern 106. The barrier 108 may be made of tantalum, tantalum nitride, titanium, titanium nitride, nitrogen-containing materials, silicon-containing materials or the like, and the barrier 108 is placed to prevent or reduce undesired leak or diffusing of the metal conductor into the dielectric layer (the first dielectric layer 103). The thickness of the barrier 108 may be about 0.01 μm to 1 μm.

In some embodiments, a via 109 is extended from the contact pad 105 through the body of the first passivation layer 103 to make contact with a top metal 110 in the interconnect structure 102. The via 109 is electrically connected to the contact pad 105 and the interconnect structure 102. The via 109 and the contact pad 105 may include the same material. In some embodiments, the via 109 includes conductive material such as gold, silver, aluminum, copper, nickel and/or alloys. In some embodiments, the contact pad 105 is electrically connected to the MIM capacitor 107 disposed within the first passivation layer 103 through the via 109. In some embodiments, the contact pad 105 is electrically connected to the via 109 and the top metal 110 in the interconnect structure 102 through the via 109.

In some embodiments, the under-bump metallization layer (UBM) 111 is disposed over the second passivation layer 104 and the contact pad 105. In some embodiments, the under-bump metallization layer (UBM) 111 is formed on the exposed portion of the contact pad 105 and along the top surface and sidewalls of the second passivation layer 104. The under-bump metallization layer (UBM) 111 includes at least one conductive layer formed of titanium, tantalum, titanium nitride, tantalum nitride, copper, copper alloys, nickel, tin, gold or a combination thereof. The under-bump metallization layer (UBM) 111 may be formed by an electrochemical plating process or a sputtering process.

In some embodiments, the bump 112 is formed on the under-bump metallization layer (UBM) 111. The bump 112 may be a pillar bump or a spherical bump and may be made of conductive material such as copper, nickel, aluminum. In some embodiments, the bump 112 in connection with the under-bump metallization layer (UBM) may be disposed over the contact pad 105. In another embodiment, a solder 113 is disposed over the bump 112 and is exposed to its surroundings (exposed from the semiconductor structure 100) and is to be coupled to another die/chip.

In some embodiments, the bump 112 is disposed over the contact pad 105. In one embodiment, the bump 112 is vertically disposed over the contact pad 105. In another embodiment, the entire bump 112 is disposed over the contact pad 105. In some other embodiments, the bump 112 is aligned with the contact pad 105. In some embodiments, the bump 112 is centrally aligned with the contact pad 105 such as a central axis of the bump 112 is aligned with a central axis of the contact pad 105.

In some embodiments, a polymer layer 114 is applied. The polymer layer 114 may include polyimide (PI), epoxy, benzocyclobutene (BCB) or polybenzoxazole (PBO), but the disclosure it not limited thereto. The polymer layer 114 overlays the second passivation layer 104 and is in contact with the bump 112. In one embodiment, after applying the polymer layer 114, less than half of the bump 112 is exposed. In another embodiment, after applying the polymer layer 114, about half of the bump 112 is exposed. The polymer layer 114 may comprise an organic material such as polyimide or epoxy. The thickness/height of the polymer layer 114 can be about ¼ to ¾ of the height of the bump 112.

In some embodiments, the polymer layer 114 is formed and patterned over the second passivation layer 104 and followed by performing a curing process. During the curing process, the polymer layer is cured by solidifying the polymer with heat. In some embodiments, a curing temperature may be between approximately 200° C. to 400° C. in ambient air, nitrogen, oxygen, etc., the time may be between approximately 30 to 300 minutes. The thickness of the polymer may be about 1 μm to 10 μm.

In another embodiment, the curing process can be an ultraviolet curing, the curing process may involve light intensity between 300 nm to 1000 nm wavelength range. Yet in another embodiment, the curing process involves electromagnetic radiation using an electromagnetic microwave radiation source operated at around 100 MHz to 1000 MHz.

Figure 2:
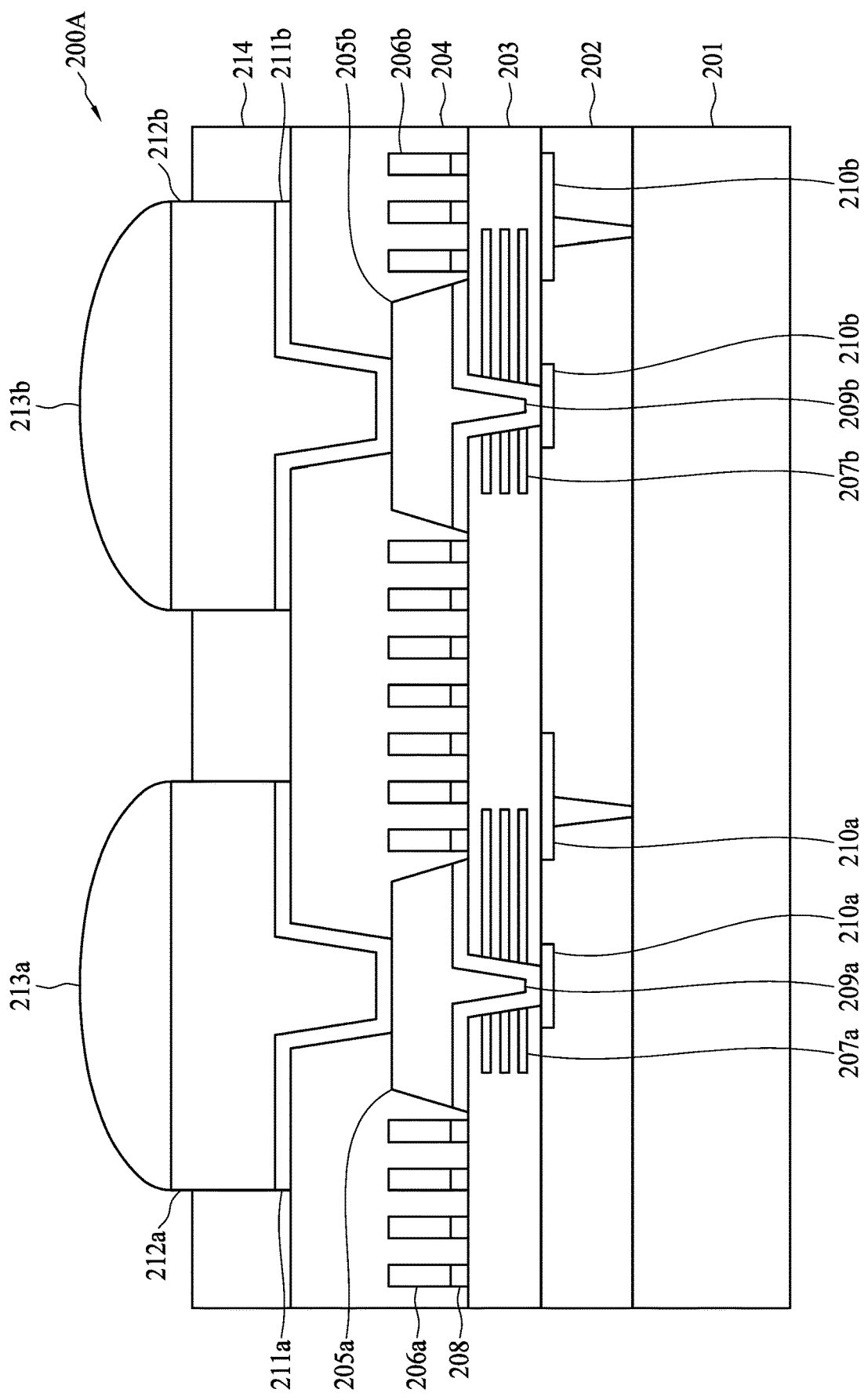
FIG. 2 is a schematic cross sectional view of a semiconductor structure in accordance with some embodiments of the present disclosure.

FIG. 2 is a schematic cross sectional view of a semiconductor structure 200A in accordance with various embodiments of the present disclosure. In some embodiments, the semiconductor structure 200A includes a semiconductor substrate 201, an interconnect structure 202, a first passivation layer 203, a second passivation layer 204, a first contact pad 205a, a second contact pad 205b, a first dummy pattern 206a, a second dummy pattern 206b, a first under-bump metallization layer (UBM) 211a, a second under-bump metallization layer (UBM) 211b, a first bump 212a, a second bump 212b, a first solder 213a and a second solder 213b.

The semiconductor structure 200A includes a semiconductor substrate 201 which may include integrated circuit devices. The semiconductor substrate 201 is disposed on a first surface of the interconnect structure 202 and the first passivation layer 203 is disposed on a second surface of the interconnect structure 202 opposite to the semiconductor substrate 201. A first passivation layer 203 is disposed over the interconnect structure 202 and is in contact with the first contact pad 205a and the second contact pad 205b, and a second passivation layer 204 is disposed over the first passivation layer 203. In one embodiment, a first dummy 206a and a second dummy 206b are disposed on the first passivation layer 203. In some embodiments, the first dummy 206a is coupled to or separated from the first contact pad 205a. In other embodiments, the second dummy 206b is coupled to or separated from the second contact pad 205b.

In some embodiments, a first MINI capacitor 207a and a second MIM capacitor 207b are disposed within the first passivation layer 203. A first via 209a is extended from the first contact pad 205a through the body of the first passivation payer 203 and is electrically connected to a first top metal 210a embedded in the interconnect structure 202. A second via 209b is extended from the second contact pad 205b through the body of the first passivation payer 203 and is electrically connected to a second top metal 210b embedded in the interconnect structure 202.

In some embodiments, a barrier 208 is disposed between the first contact pad 205a and the first passivation layer 203, the barrier 208 is also disposed between the first dummy pattern 206a and the first passivation layer 203. The barrier 208 is further disposed along the side walls of the first via 209a and the bottom surface of the first via 209a. Furthermore, the barrier 208 is disposed between the second contact pad 205b and the first passivation layer 203, the barrier 208 is also disposed between the second dummy pattern 206b and the first passivation layer 203. In some embodiments, the barrier is further disposed along the side walls of the second via 209b and the bottom surface of the second via 209b.

In some embodiments, a first under-bump metallization layer (UBM) 211a and a second under-bump metallization layer (UBM) 211b are disposed over the first contact pad 205a and the second contact pad 205b, respectively. A first bump 212a is disposed over the first under-bump metallization layer (UBM) 211a and a second bump 212b is disposed over the second under-bump metallization layer (UBM) 211b. In another embodiment, a polymer layer 214 is disposed over the second passivation layer 204 and is in contact with the first bump 212a and the second bump 212b.

In some embodiments, the first dummy pattern 206a and the second dummy pattern 206b each includes a plurality of dummy units. Each of the plurality of dummy units is separated from the first contact pad 205a and the second contact pad 205b. The number of dummy units is not limited. In one embodiment, the plurality of dummy units surrounds the periphery of the contact pads 205a and 205b. The plurality of dummy units may (or may not) be of the same height as the contact pad 205a and 205b. The plurality of dummy units may (or may not) be in a uniformed shape. A width of each of the plurality of dummy units of the first dummy pattern 206a may be between approximately 1 μm and 30 μm, and a width of each of the plurality of dummy units of the second dummy pattern 206b may be between approximately 1 μm and 30 μm, but the disclosure is not limited thereto. In another embodiment, each of the plurality of the dummy units is spaced from one another and the distance between each of the plurality of the dummy units may be between approximately 2 μm and approximately 30 μm, but the disclosure is not limited thereto. In another embodiment, the plurality of the dummy units is scattered around the contact pads 205a and 205b. In another embodiment, the plurality of the dummy units is equally spaced apart from one another.

In some embodiments, the plurality of dummy units is arranged to form an array. For example, FIG. 2 illustrates the semiconductor structure 200A showing the plurality of dummy units of the first dummy pattern 206a surrounding the first contact pad 205a and the plurality of dummy units of the second dummy pattern 206b surrounding the second contact pad 205b are disposed across the surface of the first passivation layer 203 to form a continuous array of dummies. In some embodiments, the plurality of dummy units between the first contact pad 205a and the second contact pad 205b is equally spaced from one another. In other embodiments, the distance between each of the plurality of dummy units of the first dummy pattern 206a and the second dummy pattern 206b may (or may not be) uniformed.

Figure 3:
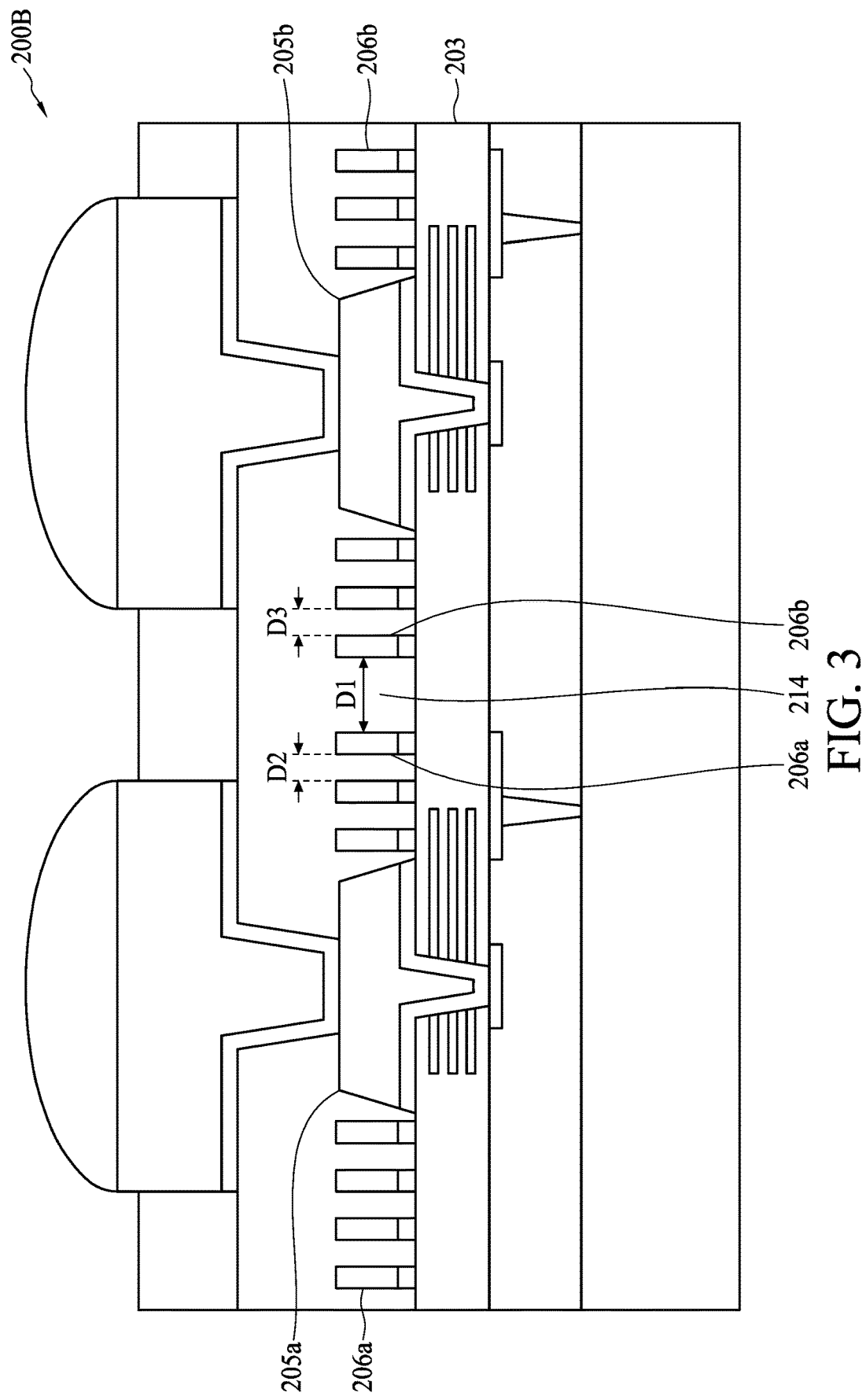
FIG. 3 is a schematic cross sectional view of a semiconductor structure in accordance with some embodiments of the present disclosure.

FIG. 3 is a schematic cross sectional view of a semiconductor structure 200B in accordance with various embodiments of the present disclosure. The semiconductor structure 200B illustrates an array of the first dummy pattern 206a disposed around the first contact pad 205a and an array of the second dummy pattern 206b disposed around the second contact pad 205b. A gap 214 with a distance D1 is disposed between the array of the first dummy pattern 206a and the array of the second dummy pattern 206b on the surface of the first passivation layer 203. A first distance D1 of the gap 214 may be approximately 1.8 µm to 100 µm. A second distance D2 between each of the plurality of dummy units of the first dummy pattern 206a may be between approximately 2 µm to 30 µm, but the disclosure is not limited thereto. A third distance D3 between each of the plurality of dummy units of the second dummy pattern 206b may be between approximately 2 µm to 30 µm, but the disclosure is not limited thereto. The second distance D2 between each of the plurality of dummy units of the first dummy pattern 206a may (or may not be) uniformed, and the third distance D3 between each of the plurality of dummy units of the second dummy pattern 206b may (or may not be) uniformed. Significantly, the first distance D1 may be greater than the second distance D2 and the third distance D3. Also, the distance between the first contact pad 205a and the second contact pad 205b may be approximately 80 µm to 200 µm, but the disclosure is not limited thereto.

Figure 4B:
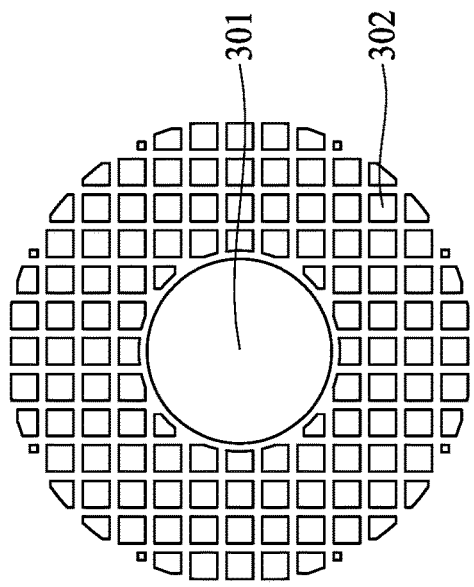
FIG. 4A to FIG. 4C are top views of a semiconductor structure in accordance with some embodiments of the present disclosure.
Figure 4C:
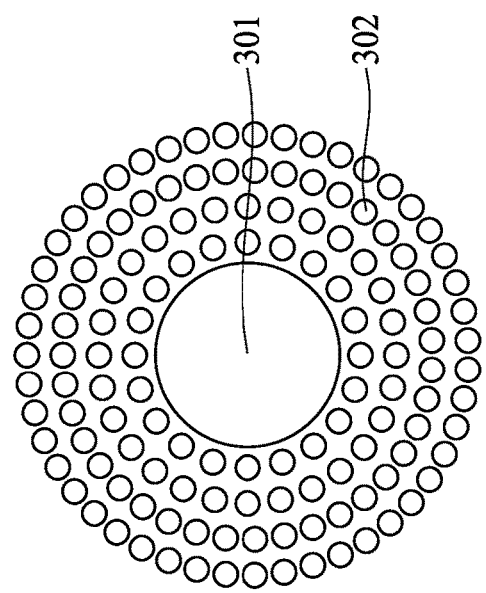
Figure 4A:
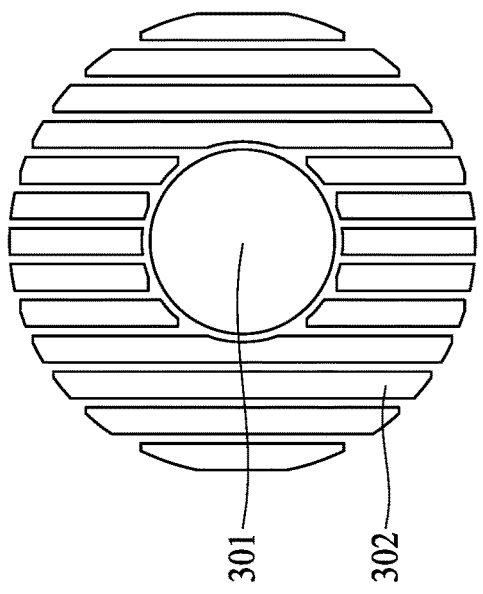

FIG. 4A to FIG. 4C are top views of a semiconductor structure in accordance with some embodiments of the present disclosure. In some embodiments, the dummy units 302 are disposed around the contact pad 301 and the dummy units 302 are arrays of dummies surrounding the contact pad 301. As shown in FIG. 4A to FIG. 4C, the dummy units 302 may be in the forms of dummy blocks, dummy islands or dummy pillars. Each of the dummy units 302 may be a cylinder, a cuboid, a cube or any desired geometric shape.

In FIG. 4A, the dummy units 302 are arrays of dummy blocks disposed along the periphery of the contact pad 301. In some embodiments, each of the dummy blocks is laterally aligned to be parallel to one another. In some embodiments, each of the dummy units 302 may have a width of about 1 µm to 30 µm and a length of about 1 µm to 30 µm, but the disclosure is not limited thereto. In some embodiments, the width of each dummy block may be about 1 µm to 30 µm and the space between each dummy block may be about 2 µm to 30 µm, but the disclosure is not limited thereto. In FIG. 4B and FIG. 4C, the dummy units 302 are arrays of dummy islands or dummy pillars disposed along the periphery of the contact pad 301. Each of the dummy islands or dummy pillars may be a cylinder, a cuboid, a cube or any desired geometric shape. In some embodiments, each of the dummy islands or dummy pillars is vertically and laterally aligned with one another. In some embodiments, the width of each of the dummy islands or dummy pillars may be about 1 µm to 10 µm, the length of each of the dummy islands or dummy pillars may be about 1 µm to 10 µm, and the space between each of the dummy islands or dummy pillars may be about 1 µm to 10 µm, but the disclosure is not limited thereto. In some embodiments, a diameter of each of the dummy islands or dummy pillars may be about 1 µm to 10 µm, as shown in FIG. 4C, but the disclosure is not limited thereto.

Figure 5B:
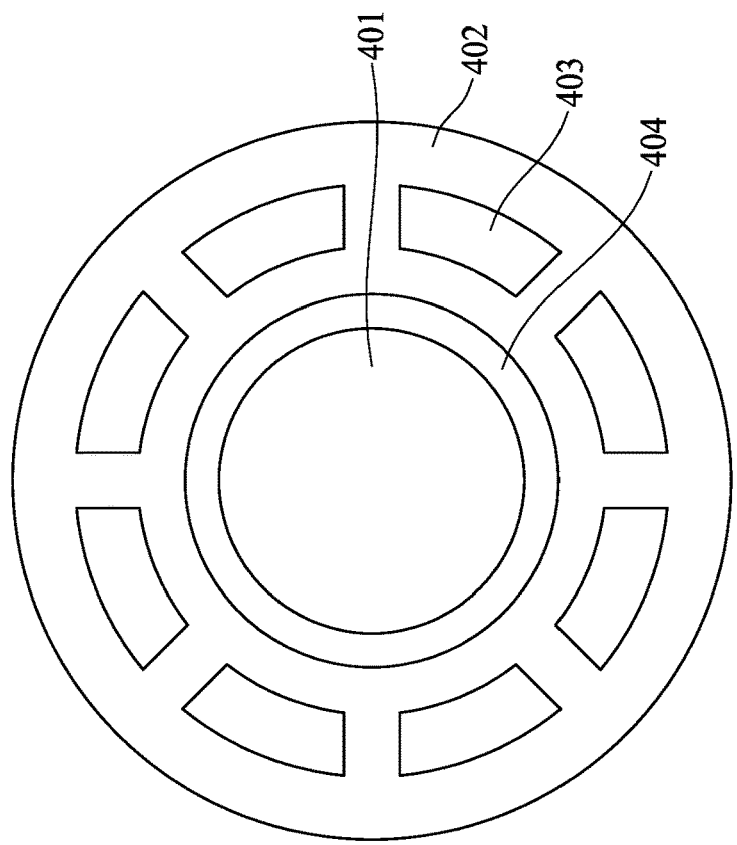
Figure 5A:
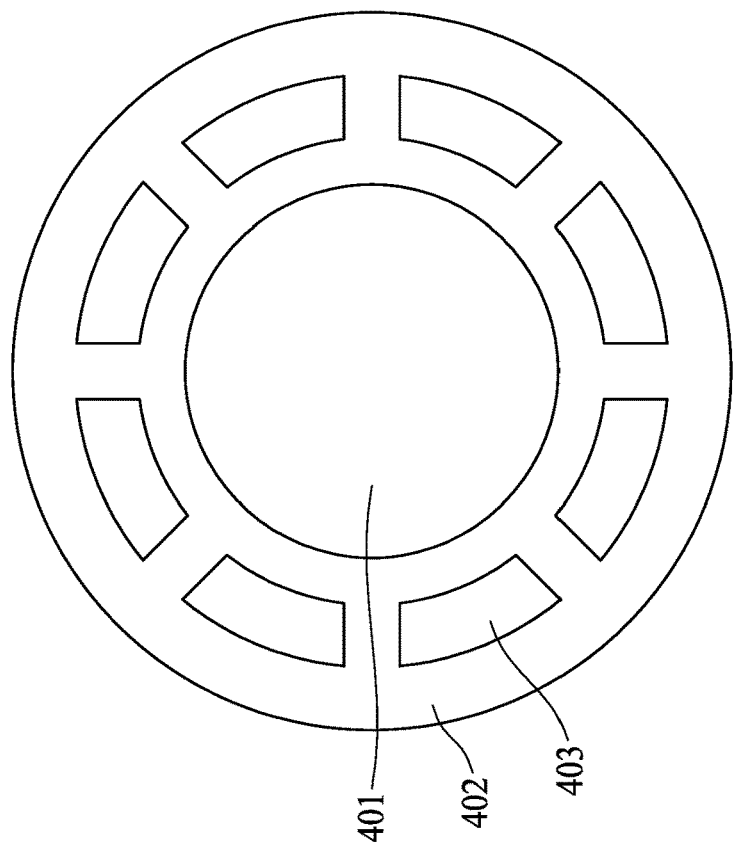

FIG. 5A to FIG. 5E are top views of a semiconductor structure in accordance with some embodiments of the present disclosure. In some embodiments, as shown in FIG. 5A to FIG. 5E, the contact pad 401 is coupled to or separated from the dummy pattern 402. The dummy pattern 402 may be an enclosed dummy unit, a framed piece with its inner rim complementing the size and shape of the contact pad 401. In FIG. 5A and FIG. 5B, the dummy pattern 402 may have a mesh hole 403. The mesh hole 403 may be an opening/ aperture within the dummy pattern 402 disposed with respect to (and along) the circumference of the contact pad 401. In some embodiments, the first passivation layer may be exposed through the mesh hole 403. In some embodiments, there may be about 1-100 mesh holes 403 disposed within the dummy pattern 402. In one embodiment, the dummy pattern 402 may be in direct contact with the contact pad 401, as shown in FIG. 5A. In another embodiment, the dummy pattern 402 may be separated from the contact pad 401 by a gap/slit 404, as shown in FIG. 5B. The gap/slit 404 between the dummy pattern 402 and the contact pad 401 may be about 1 µm to 30 µm.

In some embodiments, as shown in FIG. 5C, FIG. 5D and FIG. 5E, the dummy pattern 402 may have an inner rim complementing the size and shape of the contact pad 401. In some embodiments, a gap/slit 404 is disposed between the dummy pattern 402 and the contact pad 401, the gap/slit 404 may be about 1 µm to 30 µm. In some embodiments, the dummy pattern 402 may be a circle concentric to the contact pad 401, and a mesh hole 403 is disposed in the dummy pattern 402. In some embodiments, the first passivation layer may be exposed through the mesh hole 403. In some embodiments, the dummy pattern 402 may have a thickness about 10 µm to 240 µm and each mesh hole 403 may have a width/length/diameter about 1 µm to 10 µm. In some embodiments, each mesh hole 403 may be about 1 µm to 10 µm apart from each other. The mesh hole 403 may be in the shape of a square, a rectangle, a circle, or in any other desired shapes. In some embodiments, there may be about 1-100 mesh holes 403 disposed within the dummy pattern 402.

Also shown in FIG. 5C, FIG. 5D and FIG. 5E are different configurations of the mesh holes 403 within the dummy pattern 402. In one embodiment, as shown in FIG. 5C, the mesh holes 403 may be uniformly placed in the dummy pattern 402; an equal number of mesh holes 403 may be placed along the dummy pattern 402. In another embodiment, as shown in FIG. 5D, the mesh holes 403 may be disposed around the circumference of the dummy pattern 402. In yet another embodiment, as shown in FIG. 5E, the mesh holes 403 may be scattered within the body of the dummy pattern 402. The dummy pattern 402 may be a framed piece and may be separated from the contact pad 401. In one embodiment, the dummy pattern 402 may make contact with the contact pad 401.

Figures 7A, 7B:
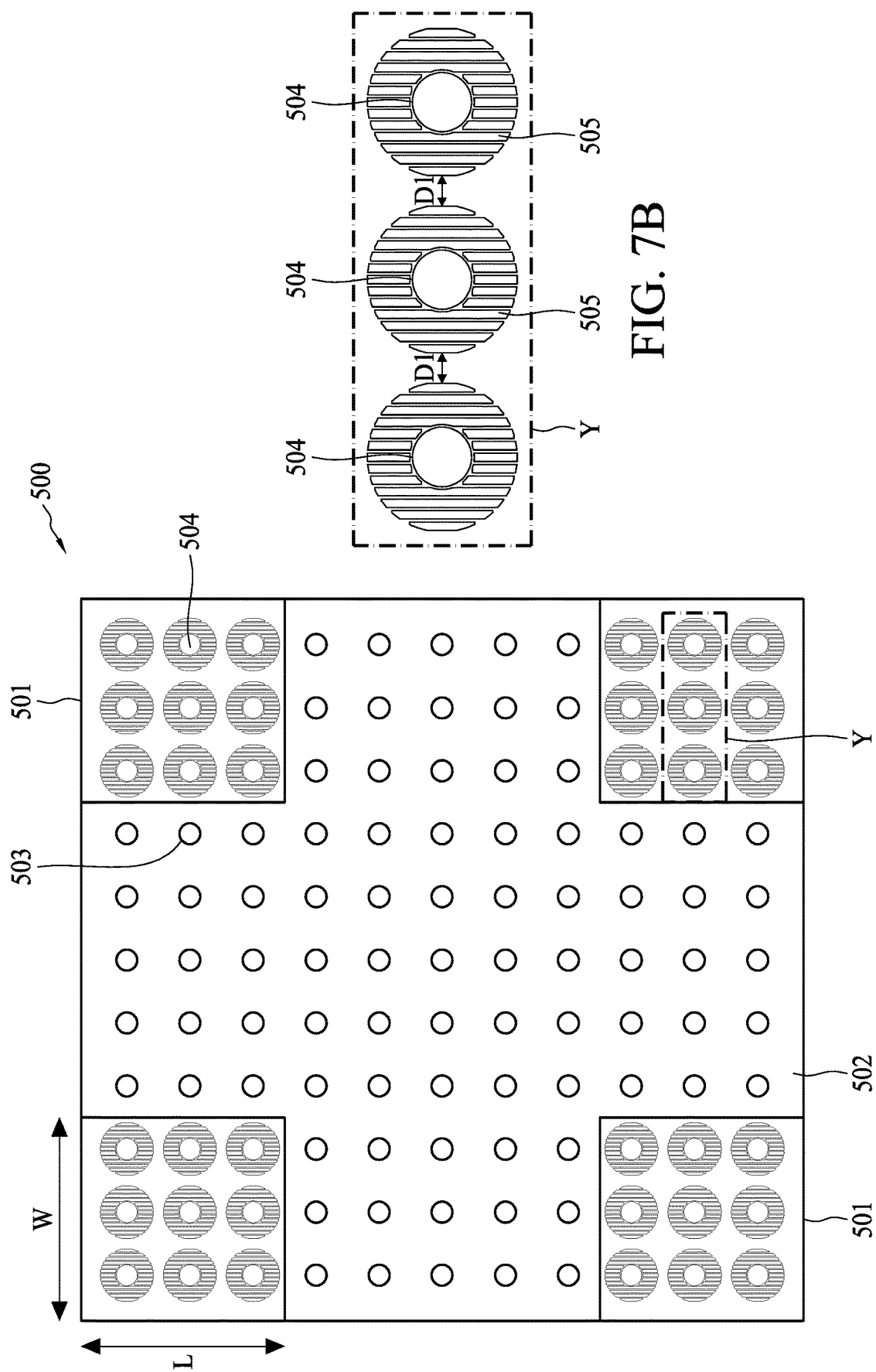
FIG. 7A and FIG. 7B are top views of a semiconductor chip in accordance with some embodiments of the present disclosure.

FIG. 6A and FIG. 7A are top views of a semiconductor structure in accordance with some embodiments of the present disclosure. In some embodiments, FIG. 6A and FIG. 7A illustrate a semiconductor chip 500 having a first region 501 and a second region 502. The first region 501 may be a corner region of the semiconductor chip 500. In some embodiments, the first region 501 occupies at least one of the corners of the semiconductor chip 500. In some embodiments, the first region 501 occupies more than one corner or all corners of the semiconductor chip 500. The length/width (L/W) of the first region 501 may be about 300 µm to 1500 µm. A plurality of contact pads 504 is disposed in the first region 501 and a plurality of contact pads 503 is disposed in the second region 502, In some embodiments, the dummy units 505 are disposed around each of the plurality of contact pads 504 in the first region 501, and the plurality of contact pads 503 in the second region 502 is free of the dummy units 505.

In one embodiment, as shown in FIG. 6A, the dummy units 505 disposed around each of the plurality of contact pads 504 are connected to form an array of dummies in the first region 501. In another embodiment, as shown in FIG. 7A, each of the dummy units 505 disposed around the plurality of contact pads 504 is separated by the distance D1 in the first region 501.

In some embodiments, FIG. 6B is a sectional view of FIG. 6A as indicated by broken lines "x". FIG. 6B illustrates three adjacent, contact pads located by an edge between the first region 501 and the second region 502; the contact pad 504 being located in the first region 501 and the contact pad 503 being located in the second region 502. The contact pads 503 in the second region 502 and the contact pads 504 in the first region 501 may include the same size. The contact pads 504 located in the first region 501 are surrounded by the dummy units 505 and the contact pad 503 located in the second region 502 is free of dummy units 505.

In some embodiments, FIG. 7B is a sectional view of FIG. 7A as indicated by broken lines "y". FIG. 7B illustrates multiple adjacent contact pads 504 in the first region 501 where the contact pads 504 are surrounded by dummy units 505, and each of the dummy units 505 is separated by the distance D1.

In some embodiments, a semiconductor package includes a semiconductor substrate, an interconnect structure disposed over the semiconductor substrate, a first passivation layer disposed over the interconnect structure, a contact pad disposed over the first passivation layer, a dummy pattern disposed around the contact pad and over the first passivation layer, a second passivation layer disposed over the dummy pattern and the contact pad, and a bump disposed over the contact pad and the second passivation layer.

In some embodiments, a semiconductor package includes a semiconductor substrate, a first passivation layer disposed over the semiconductor substrate, a first contact pad disposed over the first passivation layer, a second contact pad disposed over the first passivation layer, a first dummy pattern disposed around the first contact pad, a second dummy pattern disposed around the second contact pad, a second passivation layer disposed over the first dummy pattern, the second dummy pattern, the first contact pad and the second contact pad, and a first bump disposed over the first contact pad and a second bump disposed over the second contact pad.

In some embodiments, a semiconductor chip includes a first region defined on a corner of the semiconductor chip, a second region adjacent to the first region, a first contact pad disposed on the first region, a second contact pad disposed on the second region adjacent to the first contact pad, and a dummy pattern disposed around the first contact pad. In some embodiments, the second region is free of the dummy pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit, and scope of the present disclosure, and that they may make various changes, substitutions, and alterations herein without departing from the spirit and scope of the present disclosure.

The invention claimed is:

1. A semiconductor package comprising:
a semiconductor substrate;
an interconnect structure disposed over the semiconductor substrate;
a first passivation layer disposed over the interconnect structure;
a contact pad disposed over the first passivation layer;
a dummy pattern disposed around the contact pad and over the first passivation layer, wherein the dummy pattern comprises a plurality of dummy units arranged in an array, and each of the plurality of dummy units is separated by a distance;
a second passivation layer disposed over the dummy pattern and the contact pad; and
a bump disposed over the contact pad and the second passivation layer wherein the plurality of dummy units are coupled to the contact pad on the first passivation layer.

2. The semiconductor package of claim 1, wherein the second passivation layer comprises a polymer.

3. The semiconductor package of claim 1, wherein the plurality of dummy units comprises a plurality of dummy blocks, a plurality of dummy islands or a plurality of dummy pillars.

4. The semiconductor package of claim 1, wherein the dummy pattern disposed around the contact pad comprises a mesh hole.

5. The semiconductor package of claim 1, further comprising a barrier disposed between the contact pad and the first passivation layer.

6. The semiconductor package of claim 5, wherein the barrier is disposed between the dummy pattern and the first passivation layer.

7. The semiconductor package of claim 1, further comprising a via disposed between the contact pad and the interconnect structure.

8. The semiconductor package of claim 7, wherein the interconnect structure further comprises a top metal, wherein the top metal is in contact with the first passivation layer and the via.

9. A semiconductor package comprising:
a semiconductor substrate;
a first passivation layer disposed over the semiconductor substrate;
a first contact pad disposed over the first passivation layer;
a second contact pad disposed over the first passivation layer;
a first dummy pattern disposed around the first contact pad;
a second dummy pattern disposed around the second contact pad;
a second passivation layer disposed over the first dummy pattern, the second dummy pattern, the first contact pad and the second contact pad; and
a first bump disposed over the first contact pad and a second bump disposed over the second contact pad,
wherein each of the first dummy pattern and the second dummy pattern comprises a plurality of dummy units, and each of the plurality of dummy units comprises a plurality of dummy blocks, dummy islands or dummy pillars.

10. The semiconductor package of claim 9, wherein each of the plurality of dummy blocks, dummy islands, dummy pillars is vertically and laterally aligned with one another.

11. The semiconductor package of claim 9, wherein each of the plurality of dummy units between the first contact pad and the second contact pad is equally spaced from one another.

12. The semiconductor package of claim 9, wherein one of the dummy units of the first contact pad adjacent to one of the dummy units of the second contact pad is separated by a first distance, wherein each of the dummy units of the first contact pad is separated by a second distance and each of the dummy units of the second contact pad is separated by a third distance, wherein the first distance is greater than the second distance and the third distance.

13. The semiconductor package of claim 9, wherein the first dummy pattern makes direct contact with the first contact pad and the second dummy pattern makes direct contact with the second contact pad.

14. A semiconductor chip comprising:
   a first region defined on a corner of the semiconductor chip, wherein the first region occupies each corner of the semiconductor chip;
   a second region adjacent to the first region;
   a first contact pad disposed in the first region on the corner of the semiconductor chip;
   a second contact pad disposed in the second region; and
   a dummy pattern disposed around the first contact pad on the corner of the semiconductor chip;
   wherein the second region is free of the dummy pattern.

15. The semiconductor chip of claim 14, wherein the dummy pattern comprises a plurality of dummy blocks, a plurality of dummy islands or a plurality of dummy pillars arranged in an array around the first contact pad.

16. The semiconductor chip of claim 14, wherein the dummy pattern disposed around the first contact pad comprises a mesh hole.

17. The semiconductor chip of claim 14, wherein each of the plurality of dummy blocks, dummy islands, or dummy pillars is vertically and laterally aligned with one another.

18. The semiconductor chip of claim 14, wherein the dummy pattern is separated from the first contact pad.

19. The semiconductor chip of claim 14, wherein the dummy pattern is coupled to the first contact pad.

20. The semiconductor chip of claim 14, further comprising a passivation layer, wherein the first contact pad, the second contact pad and the dummy pattern are disposed over the passivation layer.

* * * * *